(12) United States Patent
Tran

(10) Patent No.: US 7,044,476 B2
(45) Date of Patent: May 16, 2006

(54) COMPACT PINLIFTER ASSEMBLY INTEGRATED IN WAFER CHUCK

(75) Inventor: Daniel Tran, San Jose, CA (US)

(73) Assignee: N&K Technology, Inc., Santa Clara, CA (US)

(*) Notice: Subject to any disclaimer, the term of this patent is extended or adjusted under 35 U.S.C. 154(b) by 176 days.

(21) Appl. No.: 10/723,449

(22) Filed: Nov. 25, 2003

(65) Prior Publication Data

US 2005/0111161 A1 May 26, 2005

(51) Int. Cl.
*B23B 31/30* (2006.01)
(52) U.S. Cl. .......................... 279/3; 451/289; 451/388
(58) Field of Classification Search .................. 279/3; 118/500, 724–730; 165/80.1; 432/253; 204/298.15; 156/345.23; 438/485; 451/287, 451/289, 388
See application file for complete search history.

(56) References Cited

U.S. PATENT DOCUMENTS

| | | | |
|---|---|---|---|
| 5,858,100 A * | 1/1999 | Maeda et al. ............... 118/719 |
| 5,946,184 A * | 8/1999 | Kanno et al. ............... 361/234 |
| 6,059,985 A * | 5/2000 | Yoshimura et al. ........... 216/37 |
| 6,267,853 B1 * | 7/2001 | Dordi et al. ................. 204/232 |
| 6,331,212 B1 * | 12/2001 | Mezey, Sr. .................. 118/725 |
| 6,416,647 B1 * | 7/2002 | Dordi et al. ................. 205/137 |
| 6,435,492 B1 * | 8/2002 | Behler et al. ................. 269/21 |
| 6,485,248 B1 * | 11/2002 | Taylor, Jr. .................... 414/672 |

* cited by examiner

*Primary Examiner*—Derris H. Banks
*Assistant Examiner*—Ali Abdelwahed
(74) *Attorney, Agent, or Firm*—Lumen Intellectual Property Services, Inc.

(57) ABSTRACT

A compact pinlifter assembly is fitted in a substantially enclosed cavity within a wafer chuck such that an overall outside shape of the wafer chuck remains highly unaffected. The pinlifter assembly includes wedge guides providing a movement path in a wedge angle relative to the wafer holding face. A pin actuator is driven along the wedge guides transforming its movement along the wedge guides into a vertical movement of the lifting pins perpendicularly sliding between the cavity and the wafer holding face. The combination of wedge guides and pin actuator takes advantage of the relatively large lateral dimensions of the wafer chuck to move the pin actuator between end positions that are in a distance multiple of the pin lifters movement. Due to the wedge angle, the actuators comparatively large scale movement is transformed in a highly precise, smooth and balanced movement of the pin lifters.

21 Claims, 7 Drawing Sheets

COMPACT PINLIFTER ASSEMBLY INTEGRATED IN WAFER CHUCK

CROSS REFERENCE

The present application cross references the concurrently filed and commonly owned U.S. patent application 10/723,298 titled "Compact Wafer Handling System With Single Axis Robotic Arm And Prealigner-Cassette Elevator" by Marc Aho and Daniel Tran, which is hereby incorporated by reference.

FIELD OF INVENTION

The present invention relates to pinlifter assemblies for lifting a wafer from and lowering a wafer onto a wafer chuck. Particularly, the present invention relates to pinlifter assemblies integrated within an outside diameter of a wafer chuck.

BACKGROUND OF INVENTION

During wafer fabrication, wafers are commonly transferred between a wafer chuck and a robotic arm by mechanical devices along a dual positioning axis vertical to the chuck's wafer holding face. The mechanical devices lift/lower a wafer between the chuck's wafer holding face and a loading level, where the wafer may be accessed by a robotic arm for further transportation. Such mechanical devices that employ pins to contact the bottom side or the circumference of the wafer for transfer along the dual positioning axis are commonly referred to as pinlifter assemblies.

A pinlifter assembly needs to be simple and compact while providing a smooth and balanced motion of each pin contacting the wafer. In addition, the pinlifter assembly needs to be designed around other features affiliated with the positioning and holding of the wafer. Such features may include vacuum systems for holding the wafer onto the wafer holding face and precision motion systems for moving the chuck together with the wafer. Such a motion system may be for example an X-Y stage or a rotary stage. All these limiting aspects need to be accounted for by the design of the pinlifter assembly. At the same time, the pinlifter assembly is desirably compact and highly integrated in the wafer chuck. The present invention addresses these needs.

SUMMARY OF INVENTION

A compact pinlifter assembly is fitted in a substantially enclosed cavity within a wafer chuck such that an overall outside shape of the wafer chuck remains highly unaffected. The pinlifter assembly includes wedge guides providing a movement path in a wedge angle relative to the wafer holding face. A pin actuator is driven along the wedge guides transforming its movement along the wedge guides into a vertical movement of the lifting pins perpendicularly sliding between the cavity and the wafer holding face.

The combination of wedge guides and pin actuator takes advantage of the relatively large lateral dimensions of the wafer chuck to move the pin actuator between end positions that are in a distance multiple of the pin lifters movement. Due to the wedge angle, the actuator's comparatively large scale movement is transformed to a highly precise, smooth and balanced movement of the pin lifters.

An actuator drive preferably employs a stepper motor, a reduction gear mechanism and a connecting rod transforming the rotational movement of the actuator drive into a linear movement of the pin actuator.

The pin actuator provides recesses and a cutout for all involved components as well as for an eventual vacuum connect vertically propagating across the cavity. The cavity itself may be hermetically sealed and operate itself additionally as a vacuum connect.

DETAILED DESCRIPTION

Figure 1:
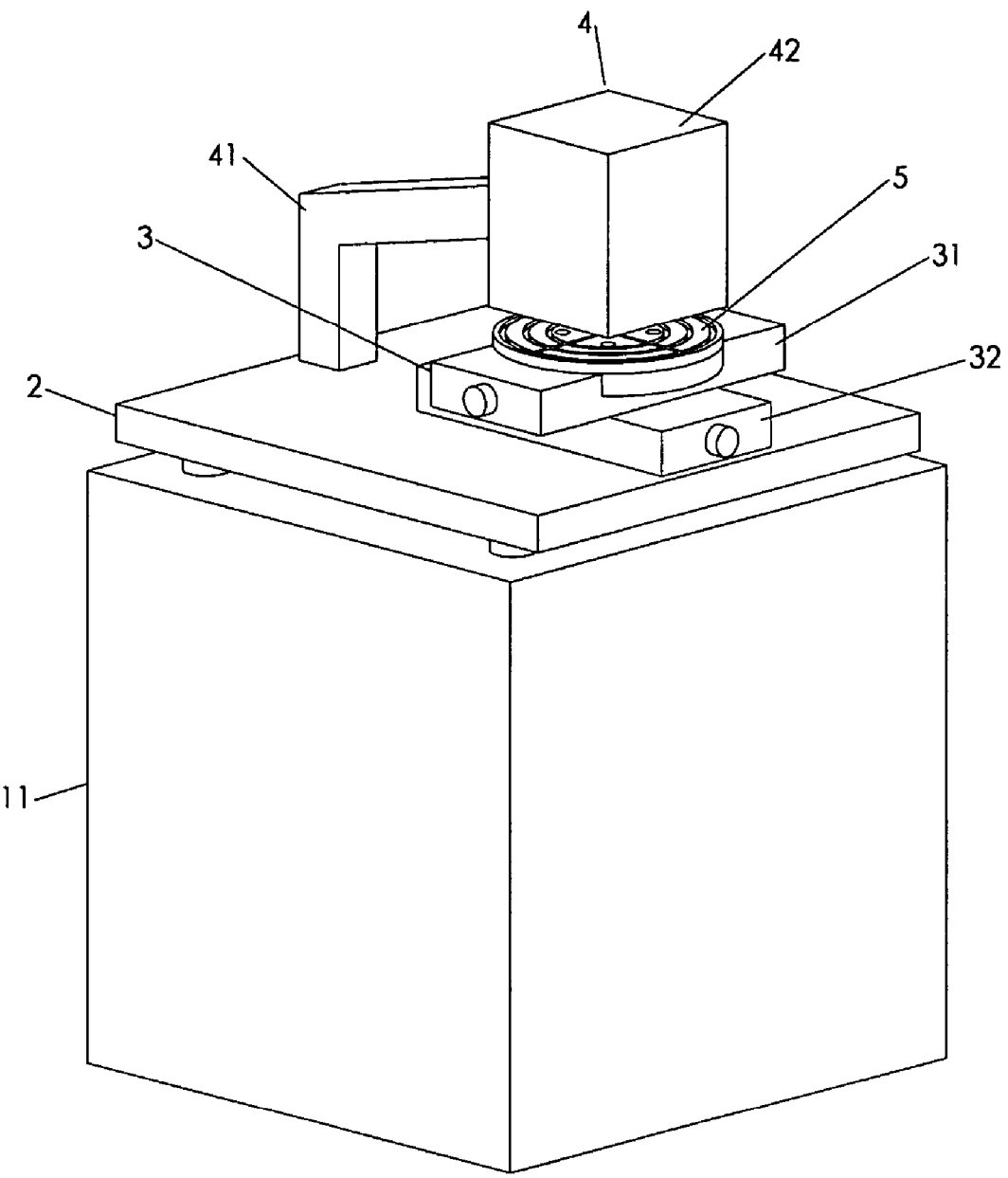
FIG. 1 is a perspective view of a wafer testing device with a wafer chuck in accordance with the preferred embodiment of the invention.

In accordance to FIG. 1, an exemplary wafer testing device 1 may be a well known spectrometer, reflectometer or other well known wafer testing device in which a well known wafer is moved and positioned with high precision beneath and relative to a measurement head 42.

The wafer testing device 1 may have a housing 11 combined with a base 2. The housing 11 may have any suitable configuration for providing structural support and for integrating additional well known components such as, for example, electrical and other supply devices, control computers and other devices that are well known parts of optical measurement devices.

The base 2 holds a measurement assembly 4 which may include a head carrying arm 41 and the measurement head 42. Attached to and carried by the base plate 2 is a stage system 3 including for example a high precision linear X-stage 31 and a high precision linear Y-stage 32. X-stage 31 and Y-stage 32 may be combined in a single commercially available device. On top of the stage system 3 is a chuck 5 for receiving and fixedly holding a wafer (not shown) during measurement.

Figure 2:
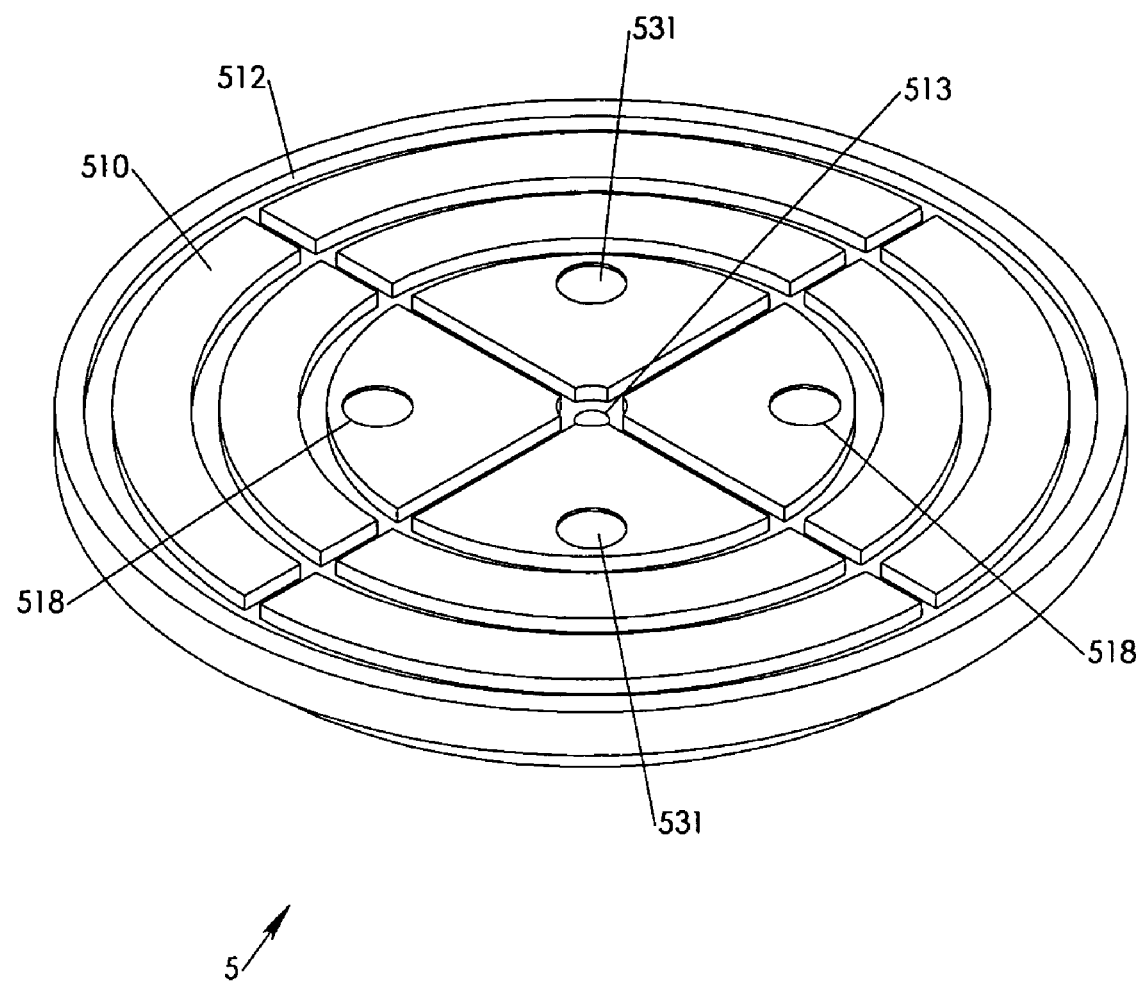
FIG. 2 is a top perspective view of the wafer chuck of FIG. 1.

Referring to FIG. 2, the chuck 5 may have a chuck body 51 featuring a wafer holding face 510, which is fabricated with high planarity and smoothness for receiving and holding a wafer. The holding face 510 may be interwoven by communicating vacuum grooves 512 for distributing a vacuum across the holding face 510. The vacuum may be used in a well known fashion to temporarily fix the wafer on the holding face 510. The vacuum grooves 512 are accessed by a vacuum channel 513 that propagates across the chuck height CH (see FIG. 3).

The chuck body 51 further features at least three but preferably four pin channels 518 preferably concentrically arranged with respect to a center axis CA of the chuck 5. The pin channels 518 are substantially perpendicular to the wafer holding face 510 and are correspondingly shaped to pinlifters 53 (see FIGS. 5, 7). The pinlifters 53 are slidably embedded in the pin channels 518 for lifting and lowering a wafer with respect to the wafer holding face 510. Each pinlifter 53 has a top face 531 and a bottom face 532 (see FIG. 5). In FIG. 2, the pinlifters 53 are shown in a bottom position, in which the top faces 531 are below the holding face 510.

Figure 3:
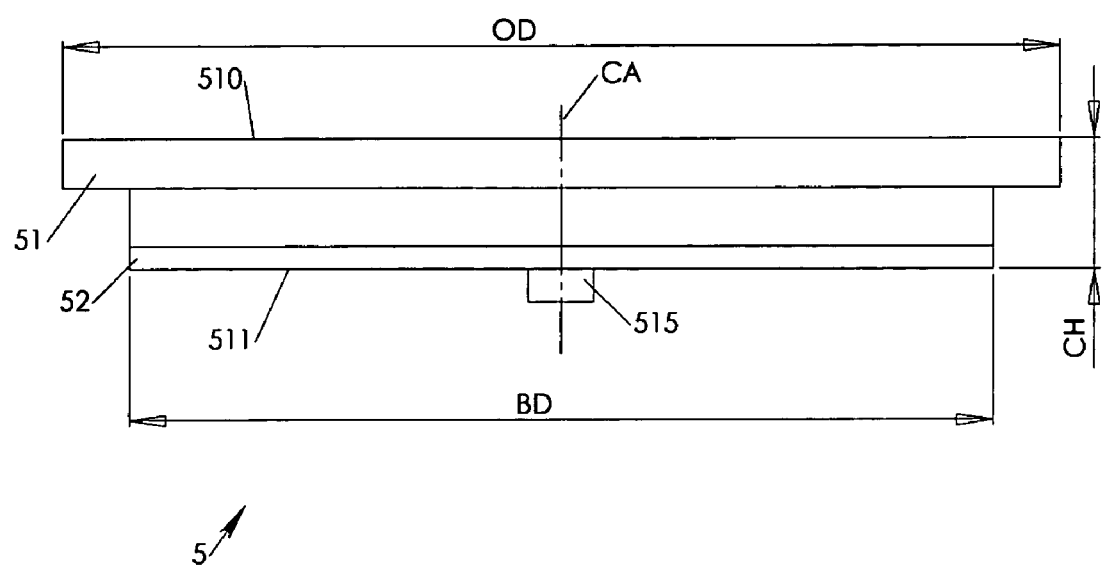
FIG. 3 is a front view of the wafer chuck of FIG. 1.
Figure 4:
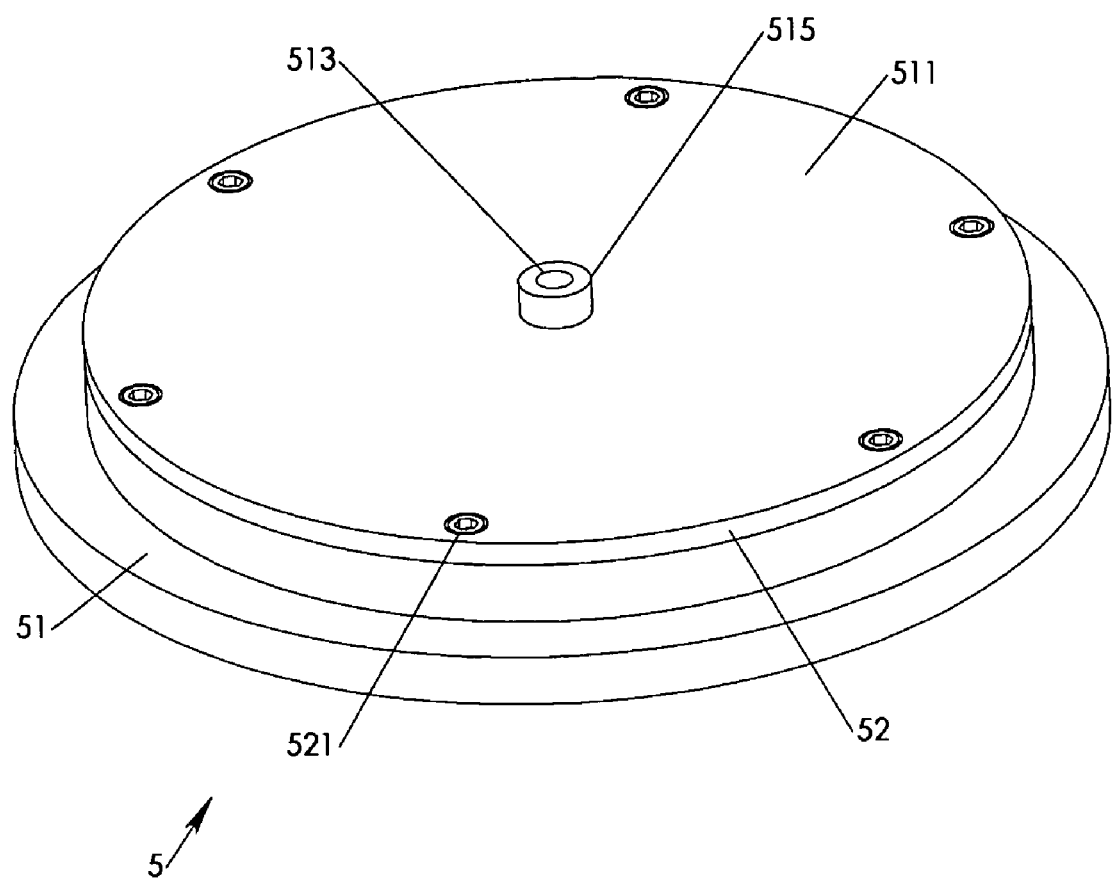
FIG. 4 is a bottom perspective view of the wafer chuck of FIG. 1.

As seen in FIGS. 3, 4, the chuck 5 has preferably a rotationally symmetric outside shape with an outside diameter OD that preferably corresponds to a diameter of a wafer intended to be placed on the chuck 5. The majority of the chuck's 5 structure is contributed by the chuck body 51. The chuck body 51 is preferably monolithically fabricated from a thermally stable and wear resistant material such as granite. The chuck 5 may have a base diameter BD that is recessed from the outside diameter OD. A base lid 52 may be attached at the bottom to the bottom of the chuck body 51 with lid screws 521. A vacuum connect 515 may extend through the base lid 52 for connecting a vacuum to the vacuum channel 513.

Figure 5:
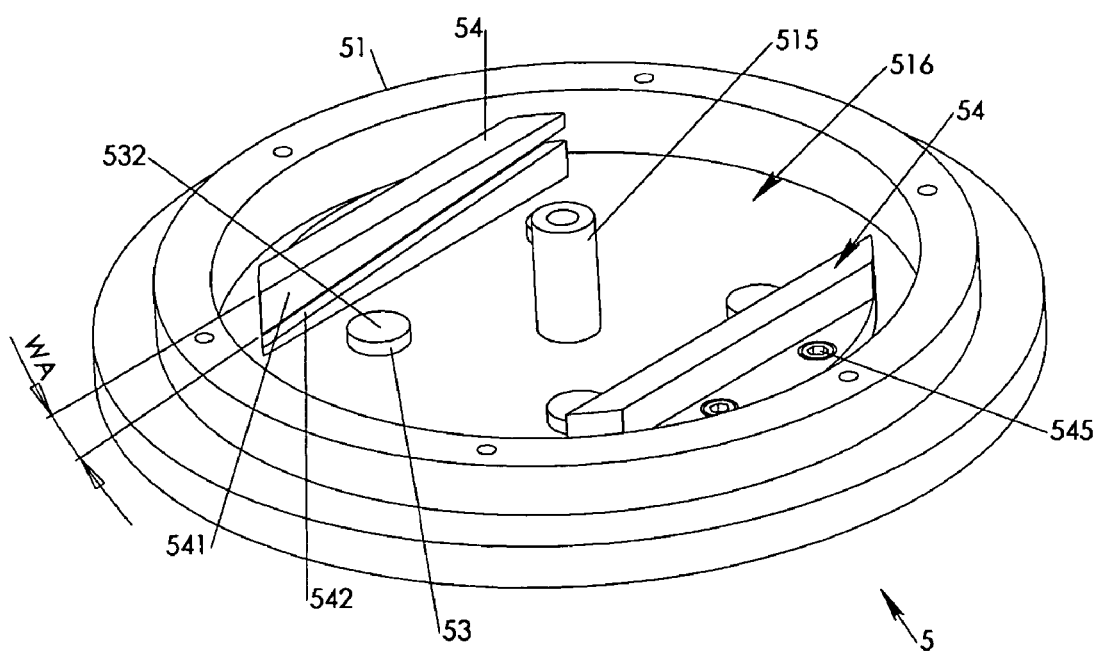
FIG. 5 is a bottom perspective view of the wafer chuck of FIG. 4 with the base lid removed and showing the chuck cavity with mounted guide structures and pinlifters extending with their bottom faces into the cavity.
Figure 6:
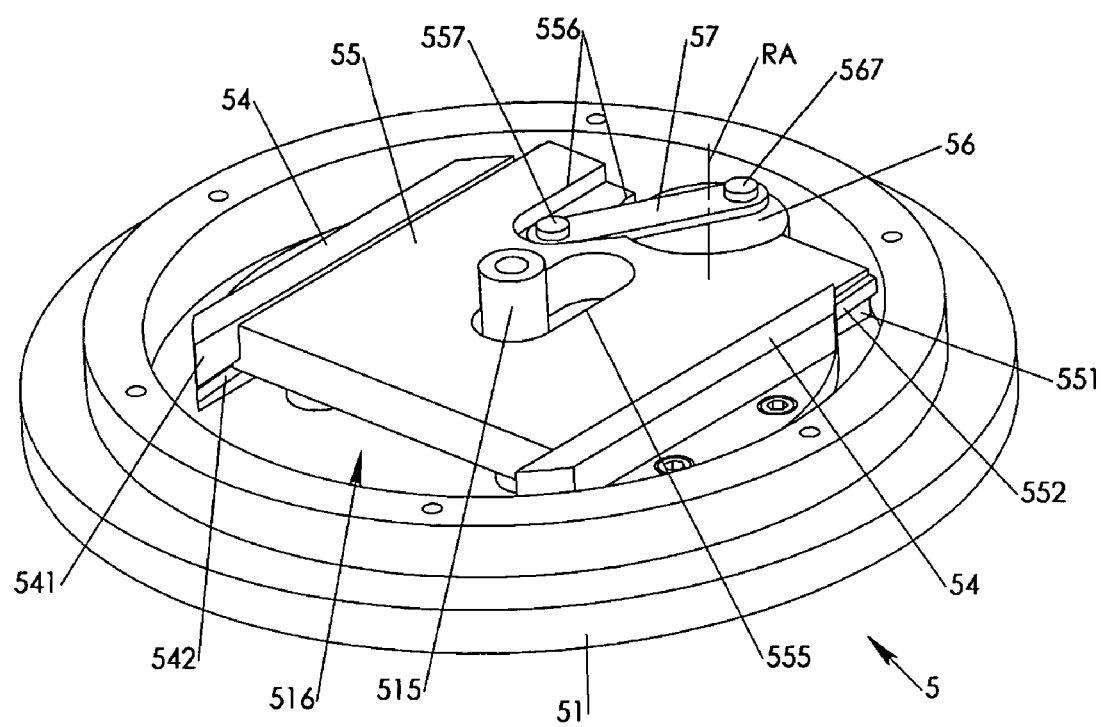
FIG. 6 is a bottom perspective view of the wafer chuck of FIG. 5 illustrating additionally the pin actuator, actuator drive and connecting rod.
Figure 7:
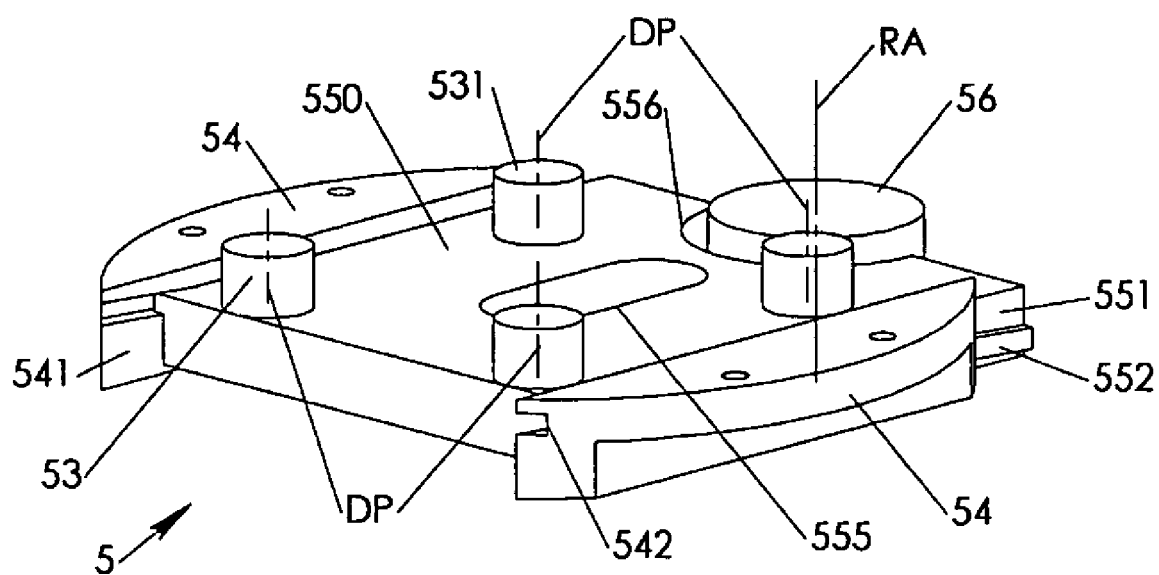
FIG. 7 is a top perspective view of guide structures, pinlifters, pin actuator and actuator drive in assembled position.

As seen in FIGS. 5, 6, 7, a cavity 516 is placed below and structurally separated from the holding face 510. The pin channels 518 extend between the holding face 510 and the cavity 516. Embedded in the cavity is a pinlifter assembly including the wedge guides 542, pin actuator 55 and driving members 56, 57. The wedge guides 542 are preferably provided by guide structures 54 preferably attached in the cavity 516 via guide screws 545. In FIGS. 5, 6, the guide structures 54 are shown as being attached to chuck body 51 but may be additionally and/or alternatively attached to the base lid 51.

The scope of the invention includes embodiments, in which the cavity 516 is at least partially provided by secondary structural components of a rotary stage, a single axis linear stage, a dual axis linear stage or any other movement device well known for precision positioning a wafer fixed to a chuck. In such embodiments, the lid 52 may be substituted by the secondary structural components. Also in such embodiments, the guide structures 54 may be attached to the secondary structural components. Particularly in the case of a rotary stage, the guide structures 54 may be attached to a non rotating portion of the rotary stage whereas the chuck body 51 is attached to a rotating portion of the rotary stage.

In other embodiments, the wedge guides 542 may be formed into the chuck body 51 and/or the base lid 51 as integral part of the cavity 516. In such cases, the guide structures 54 are omitted.

The pin actuator 55 has sliding features 552 correspondingly shaped to the wedge guides 542 and is slidably guided by said wedge guides 542. The sliding features 552 may be configured in any well known fashion such as snugly fitting profiles, line contacting glide pins or rollers.

The pin actuator 55 has a rod connect 557 via which the pin actuator 55 receives a driving force from a connecting rod 57. The connecting rod 57 in turn is hinged between the rod connect 557 and a motored rotating crank 567. The rotating crank 567 is part of actuator drive 56, which may preferably include a stepper motor and an optional reduction gear. In case where the stepper motor drives the rotating crank directly, actuator drive 56 includes the stepper motor alone.

The stepper motor is particularly suitable as a motor to be embedded inside a shallow cavity since it may be readily and commercially available in configurations with low extension along its rotation axis RA. In such case, the stepper motor may be embedded in the cavity with its rotation axis RA substantially perpendicular the holding face 510.

The scope of the invention includes embodiments, in which the pin actuator 55 may be alternatively driven by a gear rotated by the actuator drive 56 and engaging with a gear rack attached to the pin actuator 55.

The wedge guides 542 are preferably linear. In alternate embodiments, the wedge guides 542 may be circular and rotationally symmetric arranged such that the movement path is a rotation. In such case, the wedge guides 542 may be arranged such that a rotation axis of the movement path substantially coincides with the center axis CA. Also in such case, the gear rack described for embodiments in the paragraph above may be a conventional gear as may be well appreciated by anyone skilled in the art.

The vacuum connect 515 protrudes across the cavity 516. To avoid interference between the pin actuator 55 moving between its two opposing end positions, the pin actuator 55 has a cutout 555. The pin actuator 55 may also have recesses 556 to avoid interference with driving members such as connecting rod 57 and actuator drive 56. The pin actuator 55 may feature additional lateral actuator faces 551 that correspond to guide faces 541 for an eventual additional horizontal guiding of the pin actuator 55 along its movement path.

The pinlifters 53 rest with their respective bottom faces 532 on a pin contact face 550 of the pin actuator 55 such that the pinlifters 53 are simultaneously moved along pin channels 518 and the top faces 531 are moved between a bottom position below the holding face 510 and a top position above the holding face while the pin actuator 55 is moved along the movement path. The pinlifters 53 may rest spring loaded and/or gravity loaded on the contact face 550.

The top position preferably corresponds to a loading level at which the wafer may be accessed from beneath by a robotic arm for further transfer away from the chuck 5. For that purpose, the pinlifters 53 may be lowered again once the robotic arm is in loading position such that the weight of the wafer is transferred from the top faces 531 onto the robotic arm. Likewise and in an opposite sequence of steps, the pinlifters 53 may be moved into their top position while a wafer is held in position above the wafer holding face 510. The pinlifters 53 may be moved by computerized controlled powering the actuator drive 56 in a well known fashion. Within a wafer testing device 1 such as described in the concurrently filed and cross referenced application 10/723, 298 titled "Compact Wafer Handling System With Single Axis Robotic Arm And Prealigner-Cassette Elevator" the pinlifter 53 movement may be defined as a movement along dual positioning axes DP. In such testing device 1, the controlled powering may be accomplished by a control system of the testing device 1.

In the preferred embodiment, the pin contact face 550 is substantially coplanar with the holding face 510 while the pin actuator 55 is moving along the movement path. In alternate embodiments, the wedging effect between the pin actuator 55 and the pin lifters 53 may be provided by the pin contact face 550 tilted with the wedge angle WA relative to the pin actuator's 55 movement path. In such alternate case, the pin actuator 55 may be moved substantially horizontally.

In another embodiment, the cavity 516 may be substantially sealed such that a vacuum may communicate substantially unimpeded across the cavity 516. In that case, the vacuum connect 515 may extend from the cavity's 516 bottom and the core of the cavity 516 may remain free of any vacuum transmission structure that may limit the design of the pinlifter assembly.

Accordingly, the invention described in the specification above is set forth by the following claims and their legal equivalent:

What is claimed is:

1. A wafer chuck comprising:
   a. a chuck body having:
      i. a wafer holding face for holding a wafer;
      ii. a cavity structurally separated and below said wafer holding face;
      iii. at least three pin channels extending between said holding face and said cavity substantially perpendicular to said holding face;
   b. at least three pinlifters correspondingly shaped to and slidably embedded in said pin channels, each of said pinlifters having a bottom face and a top face;
   c. a pinlifter assembly embedded in said cavity, said pinlifter assembly having:
      i. a wedge guide providing an angled movement path that is in a wedge angle with respect to said wafer holding face;
      ii. a pin actuator correspondingly shaped to said wedge guide and slidably guided by said wedge guide such that said pin actuator is moved along said movement path as a result of an imposed driving force;
      iii. a driving means for said imposing of said driving force onto said pin actuator;
   wherein said bottom faces are in contact with a pin contact face of said pin actuator such that said pinlifters are simultaneously moved along said pin channels and said top faces are moved between a bottom position below said holding face and a top position above said holding face while said pin actuator is moved along said movement path.

2. The wafer chuck of claim 1, wherein said guide is provided by guide structures attached inside said cavity to said chuck body.

3. The wafer chuck of claim 1, wherein said guide is integral part of a shape of said cavity.

4. The wafer chuck of claim 1, wherein said pin contact face is substantially parallel to said holding face.

5. The wafer chuck of claim 1, wherein said pin contact face is angled with respect to said holding face and said wedge angle is substantially zero.

6. The wafer chuck of claim 1, wherein said guide is linear such that said movement path is linear.

7. The wafer chuck of claim 1, wherein said guide is circular and rotationally symmetric arranged such that said movement path is a rotation.

8. The wafer chuck of claim 7, wherein said guide is arranged such that a rotation axis of said movement path substantially coincides with a center axis of said wafer chuck.

9. The wafer chuck of claim 1 further comprising a vacuum connect having a vacuum channel for connecting a vacuum across said cavity to a vacuum groove recessed from said wafer holding face.

10. The wafer chuck of claim 9, wherein said pin actuator has a cutout such that said pin actuator may be moved between two end positions without interfering with said vacuum connect.

11. The wafer chuck of claim 1, wherein said driving means include a motored rotating crank and a connecting rod transmitting a rotating motion of said motored rotating crank onto said pin actuator.

12. The wafer chuck of claim 11, wherein said crank is motored by a stepper motor.

13. The wafer chuck of claim 12, wherein said stepper motor has a rotation axis that is substantially perpendicular to said wafer holding face.

14. The wafer chuck of claim 1, wherein said cavity is substantially sealed and communicating a vacuum substantially unimpeded between a vacuum channel and a vacuum connect, said vacuum channel connecting said cavity with a vacuum groove recessed from said wafer holding face, said vacuum connect extending from a bottom face of said wafer chuck.

15. The wafer chuck of claim 1 being part of a rotary stage.

16. The wafer chuck of claim 15, wherein said cavity is at least partially provided by said rotary stage.

17. The wafer chuck of claim 1 being part of a single axis linear stage.

18. The wafer chuck of claim 17, wherein said cavity is at least partially provided by said single axis linear stage.

19. The wafer chuck of claim 1 being part of a dual axis linear stage.

20. The wafer chuck of claim 19, wherein said cavity is at least partially provided by said dual axis linear stage.

21. The wafer chuck of claim 1 being part of a wafer testing device.

* * * * *